US010573156B2

(12) United States Patent
Figura (10) Patent No.: US 10,573,156 B2
(45) Date of Patent: Feb. 25, 2020

(54) HAND HELD PROBE FOR DETECTING THE PRESENCE OF VOLTAGE IN BODIES OF WATER

(71) Applicant: John Figura, Lake Ozark, MO (US)

(72) Inventor: John Figura, Lake Ozark, MO (US)

(*) Notice: Subject to any disclaimer, the term of this patent is extended or adjusted under 35 U.S.C. 154(b) by 0 days.

(21) Appl. No.: 15/957,337

(22) Filed: Apr. 19, 2018

(65) Prior Publication Data

US 2018/0308338 A1    Oct. 25, 2018

Related U.S. Application Data

(63) Continuation of application No. 15/495,346, filed on Apr. 24, 2017, now Pat. No. 9,959,734.

(51) Int. Cl.
| | | |
|---|---|---|
| *G08B 21/08* | (2006.01) |
| *H04Q 9/00* | (2006.01) |
| *H02J 9/06* | (2006.01) |
| *G08B 21/18* | (2006.01) |
| *G01R 19/165* | (2006.01) |
| *G08B 7/06* | (2006.01) |

(52) U.S. Cl.
CPC ..... *G08B 21/082* (2013.01); *G01R 19/16576* (2013.01); *G08B 7/06* (2013.01); *G08B 21/182* (2013.01); *H02J 9/061* (2013.01); *H04Q 9/00* (2013.01)

(58) Field of Classification Search
CPC ...... G08B 21/082; G08B 7/06; G08B 21/182; H04Q 9/00; G01R 19/165; H02J 9/061
See application file for complete search history.

(56) References Cited

U.S. PATENT DOCUMENTS

| | | |
|---|---|---|
| 3,510,766 A | 5/1970 | Russell et al. |
| 3,774,110 A | 11/1973 | Roveti |

(Continued)

FOREIGN PATENT DOCUMENTS

WO    2010078617 A1    7/2010

OTHER PUBLICATIONS boatzincs.com, Inc., "Corrosion Reference Electrode and User's Guide by ABYC—Certified Corrosion Experts" website, Sep. 18, 2010, 1 page.

(Continued)

*Primary Examiner* — Ryan W Sherwin
(74) *Attorney, Agent, or Firm* — Sandberg Phoenix & von Gontard PC (57) ABSTRACT

A hand held probe (200) for detecting voltage in a body of water includes voltage sensors (VS) installed in a probe head (204) with each sensor separately sensing a voltage present in the water and supplying an electrical output signal representative of the voltage level. A processor (206) processes the signals and produces an output representing a voltage gradient, a resultant electrical current, and a direction of current flow. A multiplexer (214) interposed between the sensors and processor transmits signals from the sensors to the processor in a predetermined sequence. Results of the processing including any voltage gradient, the resultant electrical current, and the direction of current flow are displayed and this information is used to determine if a currently dangerous or potentially dangerous condition exists in the water, and if a voltage is present in the water, its source.

16 Claims, 6 Drawing Sheets

(56) References Cited

U.S. PATENT DOCUMENTS

| | | | |
|---|---|---|---|
| 3,784,903 A | 1/1974 | Thomas | |
| 3,869,668 A | 3/1975 | Thompson | |
| 5,005,007 A | 4/1991 | Weng et al. | |
| 5,402,298 A | 3/1995 | Gershen et al. | |
| 8,643,360 B1 | 2/2014 | Cargill, III | |
| 8,686,713 B2 | 4/2014 | Cargill, III | |
| 9,285,396 B2 | 3/2016 | King, Jr. et al. | |
| 2004/0108861 A1* | 6/2004 | Germiquet | G01F 23/265 324/663 |
| 2006/0256654 A1* | 11/2006 | Paulsen | G01V 1/38 367/20 |
| 2011/0277488 A1 | 11/2011 | Peretz | |
| 2014/0301727 A1* | 10/2014 | Resh | G03B 17/08 396/28 |
| 2015/0198548 A1 | 7/2015 | Fournier et al. | |
| 2016/0154036 A1 | 6/2016 | King, Jr. et al. | |
| 2016/0299178 A1 | 10/2016 | King, Jr. et al. | |

OTHER PUBLICATIONS

Reef Central, LLC, "Can a Standard Multimeter Measure Voltage in Water?" forum webpage, Feb. 22, 2017, 4 pages, Jelsoft Enterprises Ltd.

United States Department of Agriculture ("USDA"), "Effects of Electrical Voltage/Current on Farm Animals: How to Detect and Remedy Problems," Dec. 1991, 151 pages, Agriculture Handbook No. 696, Lefcourt, A.M.

Johnson, Donald R., P.E., "The Case of Stray Voltage in a Lake" webpage, Nov. 1, 2009, 4 pages, Penton.

Electric Power Research Institute, Inc. ("EPRI"), "Elevated Neutral-to-Earth Voltage, Contact Voltage, and Other Perceptability Concerns for Humans and Animals" webpage, Feb. 22, 2017, 20 pages.

Fluke Corporation, "Testing Corrosion Protection Systems" Application Note, 1998, 2 pages.

Sam's Marine, "How Do You Measure Stray Current in the Water?" forum, Feb. 11, 2010, 2 pages.

electriciantalk.com, "Measuring Pool Water Voltage" forum, Feb. 22, 2017, 12 pages, vBulletin Solutions, Inc.

Page, Marty L., P.E., "Stray and Contact Voltage at Swimming Pools" presentation, Jun. 17, 2010, 30 pages, Southern Company and Georgia Power Company.

boatzincs.com, Inc., "Corrosion Reference Electrode" webpage, Jul. 23, 2008, 1 pages.

Cargill, III, George Slade, U.S. Appl. No. 61/696,204, filed Sep. 2, 2012, 10 pages.

boatzincs.com, Inc., "Corrosion Reference Electrode and User's Guide by ABYC-Certified Corrosion Experts" webpage, Feb. 22, 2017, 1 page.

Dock Lifeguard, LLC, "Dock Warning System for Electrical Current Detection in the Water" brochure, 2012, 2 pages.

Electric Power Research Institute (EPRI), Inc., "Pool Shocking— "Fun in the Sun" Can Be a Shocking Event" Technical Brief article, Jun. 2000, 8 pages.

\* cited by examiner

HAND HELD PROBE FOR DETECTING THE PRESENCE OF VOLTAGE IN BODIES OF WATER

REFERENCE TO RELATED APPLICATIONS

This application is a continuation-in-part of U.S. patent application Ser. No. 15/495,346 filed Apr. 24, 2017.

BACKGROUND OF THE INVENTION

This invention relates to a predictive shock alert warning system comprising sensor probes and an apparatus installed in or near a body of water such as a swimming pool, a river, or a lake. The sensors are placed in the body of water and the apparatus on, or adjacent to, the pool, a swimming dock, or a boat dock in a marina or the like. The system provides an audible and visual alarm when a sensed electrical voltage in the water is of a level approaching that which can seriously shock or electrocute people who may be in the water or about to enter the water.

It is well-known by those living on or near lakes, rivers, and other bodies of water, that a voltage associated with electrical currents or electrical gradients present in a pool or in the water near a shore, a dock, or a boat, etc., can, on occasion, rise to a level by which someone in the water and exposed to the voltage, can be seriously injured or electrocuted. Sadly, there are numerous recorded instances where people, particularly children, have died or been severely shocked when they inadvertently were exposed to a voltage which exceeded the threshold for causing injury or death. The cause of these electrical shock drowning (or ESD) conditions vary widely depending upon a number of factors with a faulty electrical ground or faulty electrical equipment being but two such conditions which can result in a current or voltage gradient near the shore, dock, or boat. Other factors include condition of the water (i.e., its salinity, temperature, if the water is clear or murky, etc.) as well as a person's body weight. Importantly, there is usually no visual indication that water in a swimming pool or in the proximity of a swimming dock, or a boat dock is electrified.

In the July, 2013 edition of Seaworthy magazine, in an article titled: ESD Explained, the author described (at page 7 of the periodical) that ESD arises from three conditions which are a) an electrical fault in which electricity is escaping from somewhere in an electrical system and is trying to find a path back to its source; b) an AC safety ground fault is present by which the AC grounding system has somehow been compromised so stray current cannot return to electrical ground through a ground safety wire; and c) there is no ground fault safety protection. The article goes on to warn about swimming within 100 yards of a marina, boat yard or any dock using electrical power. However, as noted above, despite such possible warnings, people do swim in these areas.

What level of voltage can be dangerous to someone in contact with the water? In the open access journal eplasty (www.eplasty.com) article Conduction of Electrical Current to and Through the Human Body: A Review, by Dr. Raymond Fish, a person stood in buckets filled with fresh water to a level near the person's hip. Testing indicated that with a voltage of 3.05V applied between the plates, there was an involuntary flexion of the person's knees to 90° and this flexion could not be overcome by voluntary effort of the person. With an application of 4.05V, the knee involuntarily flexed to 135°, bringing the person's foot up to near their buttock; and, again this flexion could not be overcome by voluntary effort of the person. It will be appreciated by those skilled in the art that, at a minimum, these situations could greatly affect a person's ability to swim toward a shore or a dock ladder in order to get themselves out of the water.

Also, while obviously not being tested on persons, increasing voltage levels above these values will produce an ESD condition.

Because of the notoriety surrounding ESD incidents, particularly fatal ones, when they occur, the applicants are aware of someone, as early as 2007-09, developing and installing a sensor system for detecting voltage levels which can injure or kill someone, and sound a visual and/or audio alarm to warn people near or in the water that a dangerous condition exists. The system was installed on boat docks in Central Missouri and is still in operation.

Also, as early as 1990, the United States Department of Agriculture in a handbook on Effects of Electrical Voltage/Current on Farm Animals: How To Detect and Remedy Problems addressed similar safety concerns regarding farm livestock and presented a testing apparatus for sensing dangerous voltage levels in water on farms from which animals drank or bathed. In addition, a number of U.S. patents and published applications address similar safety considerations with respect to swimming pools, large bodies of water such as lakes, as well as safety around oceanic oil drilling platforms. The patents include the following: U.S. Pat. Nos. 3,510,766; 3,784,903; 3,869,668; 5,005,007; 8,686,713; and 9,285,396. The published applications include: 2015/0198548, 2016/0154036, and 2016/0299178.

While these previous systems or devices may work well for their intended purpose, they do have drawbacks. Most importantly, as pointed out by the Electrical Shock Drowning Prevention Association (ESDPA) in their position statement of June, 2016 on "Green Light Devices", prior art detectors create a "false sense" of security in that they are reactive devices, not predictive devices. That is, they only indicate that a dangerous condition exists, not that there is an impending danger of such a condition.

In addition, existing sensors or detectors have a limited operating range. Accordingly, a threat condition may exist which could go undetected if it exists outside the current operating range of sensors. In addition, if a system employs multiple sensors, unless the sensors are isolated from one another, it may be difficult to determine the extent of a danger zone because of overlapping areas or zones of water monitored by the sensors. Further, current sensors or detectors are prone to providing false readings. These can be caused by, for example, ground loops resulting from using the earth as an electrical conductor, plastic floats that act as a capacitor whereby a varying voltage level is produced due to wave action, noise created by boat propellers, and radio frequency (rf) interference due to radio transmission equipment found on boats or docks, faulty electric motors, etc.

In many recreational areas surrounding a lake or other body of water, it is commonplace to find a large number of individual docks used by recreational home owners and their guests; and it is also commonplace for people, particularly children to swim or wade in the water around such docks. Further found in these areas are multi-slip docks maintained by hotels, boat rental facilities, etc. Each such site represents a separate location for potential danger given the large amount of electrical equipment (lighting, audio systems, winches, etc.) located on or near these installations.

One issue for owners of these properties is insurance. A reliable shock detection system, properly installed and in compliance with local ordinances helps keep insurance premiums down for owners of these properties because such an installed system assures a safe environment for swimmers, boaters, etc.

Accordingly, there is a need for a simple, efficient shock alert warning system using reliable sensors and associated apparatus which accurately detect voltage levels approaching, reaching, or exceeding a danger threshold and which automatically alarm people in the vicinity of a danger area, as well as those having oversight of the area. Doing so can provide additional assurance that the safety of those otherwise in danger, as well as alerts those responsible for the site, of the need to find the cause of the problem producing the dangerous condition and fixing it.

The shock alert warning system described hereinafter accurately predicts a potentially dangerous condition and provides visual and verbal alarms of such. In doing so, it relies upon probes installed at various locations in the water around a dock. It has now been found that addition to the probes, use of a handheld portable probe which a user can move around and about a dock or a boat can usefully supplement the monitoring of potentially dangerous conditions by the in-water probes to improve the monitoring and further insure people's safety.

Such a portable probe is also described herein.

BRIEF SUMMARY OF THE INVENTION

The present disclosure is directed to a shock alert warning system including a plurality of sensor probes and associated apparatus for detecting and providing an indication of voltage levels in the water, and sensed by one or more of the sensor probes, that are approaching and may subsequently exceed a danger threshold and can cause serious injury or death to a person in or near the water or about to enter the water. The voltage levels associated with these thresholds are with regard to the voltage levels noted in the above referenced article in the Background section of this application. Since the system provides an indication and an alarm, including a verbal alarm, of the approach of a dangerous condition, it provides a predictive capability regarding such conditions.

The sensor probes are each located in a different zonal area of water at the monitored site so to enhance coverage by the system. The probes are electrically isolated from each other and operate independently of each other so to enhance the apparatus' ability to reliably monitor each zone. The apparatus and probes are readily installed and positioned about a boat dock or swimming pool or platform, as well as multi-slip boat docking facilities.

The apparatus and probes are designed for safe and reliable operation and, when the system is installed by a competent electrician in accordance with the system's guidelines, will comply with local ordinances relating to them. Signals transmitted from the probes are processed to eliminate false readings which can arise from a number of factors. Further, when the input from a particular probe indicates a potential dangerous condition, the apparatus is programmed to focus on inputs from that probe to ascertain the severity of that condition, while still monitoring inputs from each of the other probes.

The apparatus constantly monitors the sensed voltage output of each probe and if a signal is detected from a probe indicating the voltage level within a certain zone is approaching, has reached, or exceeds a predetermined threshold of danger, the apparatus "locks" onto that zone, displays the level of detected voltage for that zone and provides an alarm warning of danger with regard to that zone.

The alarm provided by the apparatus is both audio (including a verbal alarm) and visual and is provided both at the dock site as well as in other areas. These include a house, hotel, or boat facility located in proximity to the dock, as well as a fire or police station or the location of other first responders. In a multi-slip facility, for example, audio and visual alarm indicators are placed at spaced locations along the dock adjacent each slip.

The system operates on AC power, with a battery backup, and its components are housed in a weather resistant enclosure. If the apparatus is installed on a dock, it detects both if the dock is electrified as well as if the water surrounding the dock is electrified.

In addition to the system, a handheld portable probe comprises a plurality of voltage sensors which sense the presence of voltage in a body of water and, if a voltage is present, a resulting voltage gradient, a corresponding electric current, and direction of current flow. This information is important in locating the voltage source, so the condition causing the presence of the voltage can be readily found and corrected.

The handheld probe employs a plurality of voltage sensors whose output signals are multiplexed prior to processing to assist in the processing. Outputs from the handheld probe are wirelessly transmitted to the warning system for the system to provide the visual and verbal alarms in conformity with operation of the apparatus. These outputs are also provided to remote sites.

The handheld probe is relatively lightweight and easy to use. When not in use, the probe is stored in a docking station located on the dock or boat, the station having means for recharging a battery used to power the handheld probe.

Other objects and features will be in part apparent and in part pointed out hereinafter.

BRIEF DESCRIPTION OF THE SEVERAL VIEWS OF THE DRAWINGS

The accompanying figures, together with detailed description which follows, form part of the specification and illustrate the various embodiments described in the specification.

Corresponding reference characters indicate corresponding parts throughout the several views of the drawings.

DETAILED DESCRIPTION OF INVENTION

The following detailed description illustrates the invention by way of example and not by way of limitation. This description clearly enables one skilled in the art to make and use the invention, and describes several embodiments, adaptations, variations, alternatives and uses of the invention, including what is presently believed to be the best mode of carrying out the invention. Additionally, it is to be understood that the described system and method is not limited in its application to the details of construction and the arrangement of components set forth in the following description or illustrated in the drawings. The described system and method is capable of other embodiments and of being practiced or carried out in various ways. Also, it will be understood that the phraseology and terminology used herein is for the purpose of description and should not be regarded as limiting.

Figure 2:
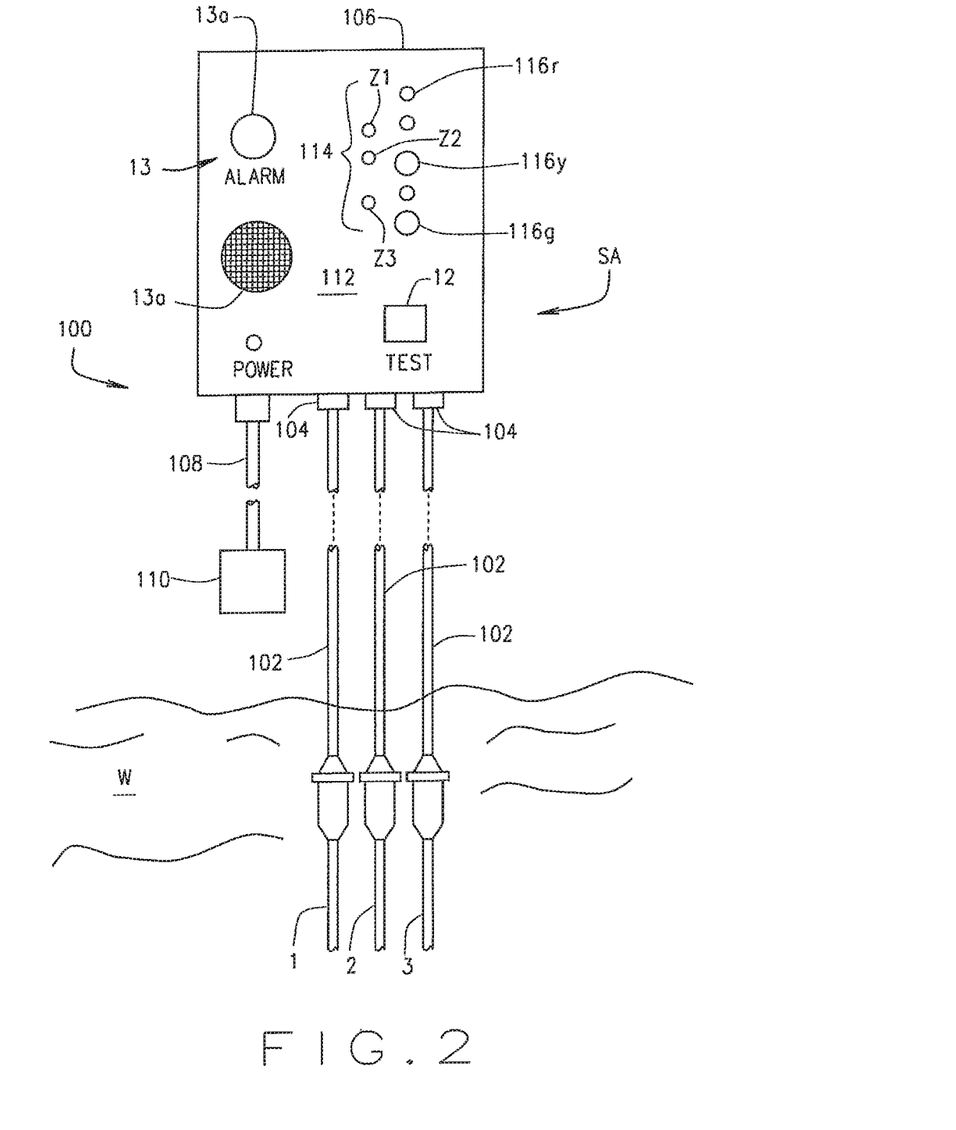
FIG. 2 is a representative view of the sensor and apparatus when installed on, for example, a dock.
Figure 3A:
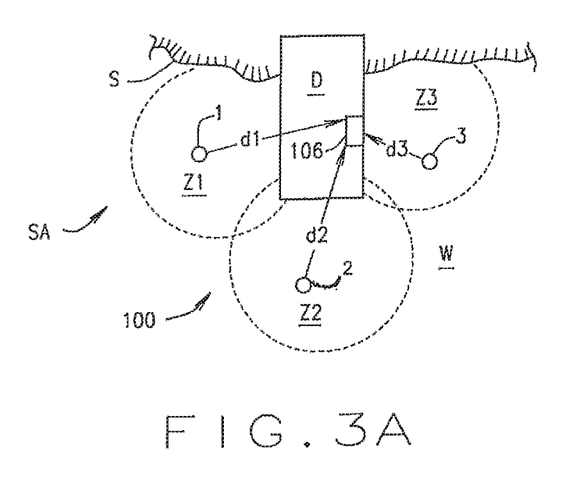
FIG. 3A is a representation of the apparatus installed on a dock and with multiple sensor probes so located as to provide voltage readings within different zones of water about the dock.
Figure 3B:
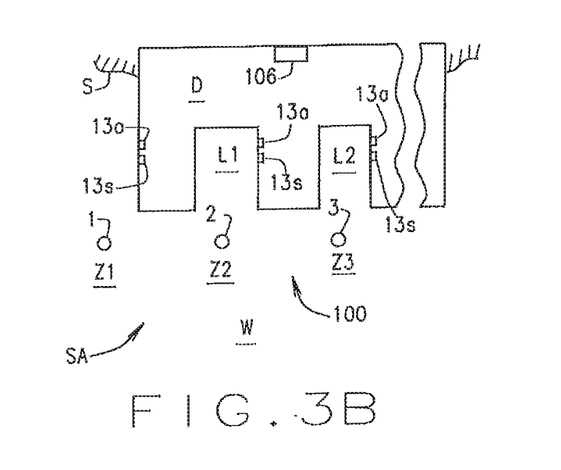
FIG. 3B is a representation of a multi-slip docking facility with multiple sensor probes so located as to provide voltage readings for zones of water associated with each slip.
Figure 4:
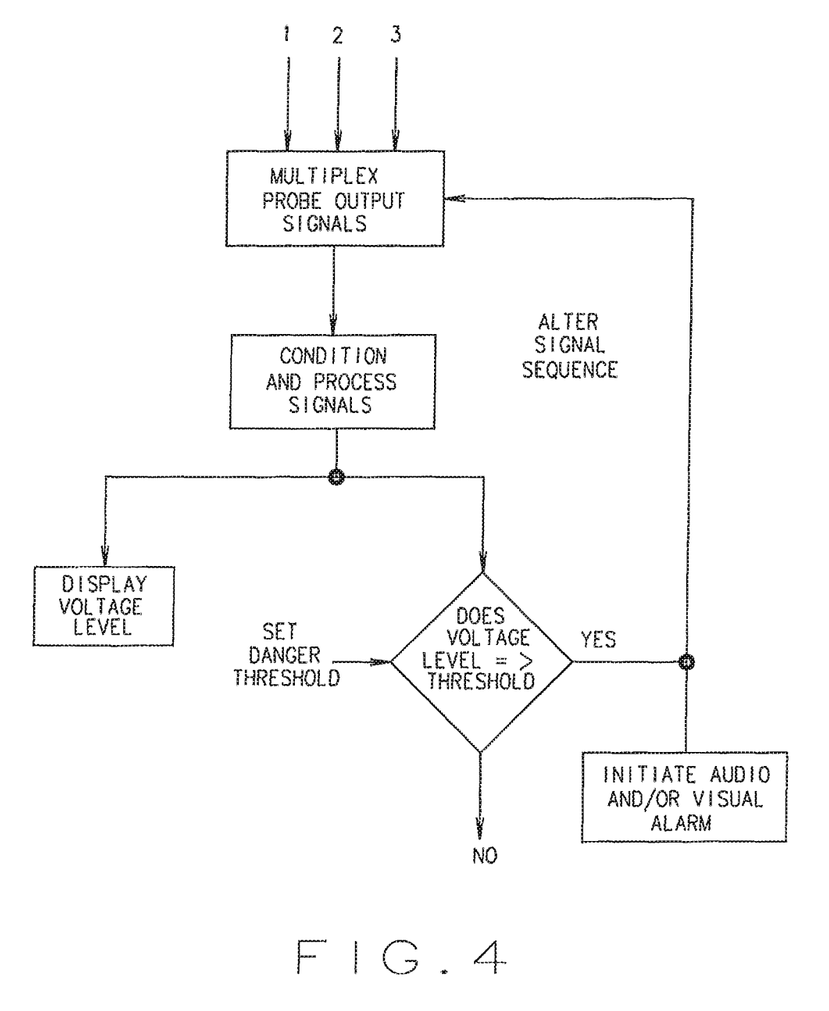
FIG. 4 is a block diagram of the system's operation.

Referring to the drawings, a shock alert system SA of the present invention includes apparatus indicated generally 100. As shown in FIGS. 3A and 3B, apparatus 100 is, for example, installed on a dock D which extends into a body of water W from a shoreline S. Apparatus 100 is used in conjunction with one or more sensor probes of the shock alert system three of which probes designated 1, 2, and 3 are shown in the drawings. Those skilled in the art will appreciate that the system and apparatus can accommodate more than three sensor probes without departing from the scope of the invention. Referring to FIG. 2, each probe 1-3 is separately connected to apparatus 100 by a connecting line 102 which extends between a connector 104 mounted on an enclosure 106 in which components of apparatus 100 are housed, and the respective sensor probe. Those skilled in the art will appreciate that a ground probe is not required for the system to function to detect and warn of dangerous voltage levels; however, a ground probe may be utilized.

Enclosure 106, which is a water resistant enclosure, is installed at a convenient location on dock D and the apparatus is connected to a source of AC power through a power line 108 attached to a plug 110 which is inserted into an electrical outlet preferably located adjacent the enclosure. A voltage transformer 109 is installed within enclosure 106 and the electrical ground for the system is connected to dock D through the transformer housing. For safety purposes, a backup battery B, see FIG. 1, is also installed in enclosure 106.

Once apparatus 100 is in place, each of the probes 1-3 is positioned in a different area of the water adjacent the dock. As shown in FIG. 3A, probe 1 is positioned in an area designated zone Z1, probe 2 in a different area designated zone Z2, and probe 3 in another different area designated zone Z3. As shown in FIG. 3A, there may be a slight overlap between the zones of coverage by the respective probes; although the probes are placed sufficiently far apart that there is generally no overlap between them and they are electrically isolated from, and function independently of, each other so to independently monitor the voltage level in the zone monitored by the probe. Further, each of the probes may be placed a respective distance d1, d2, or d3 from apparatus 100. The distances d1, d2, or d3 may be different from each of the other two distances, and each distance may exceed 40', for example, from apparatus 100.

Figure 1:
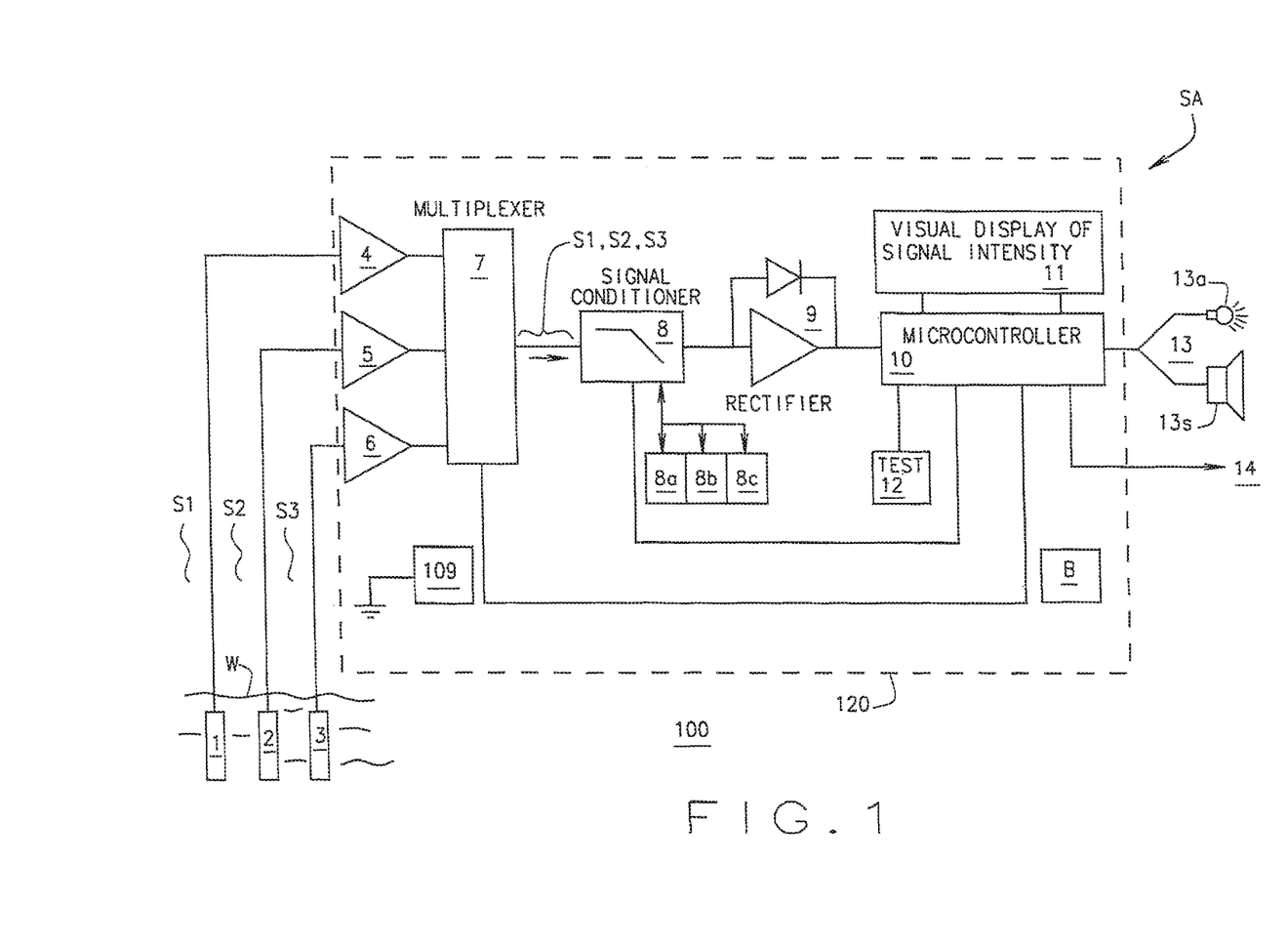
FIG. 1 is a block diagram of sensors and an apparatus of the shock alert warning system of the present invention.

Referring to FIG. 1, analog electrical signals S1, S2, and S3 from respective sensor probes 1-3, and representing voltages sensed by the respective probes, are transmitted through respective buffer amplifiers 4-6 to convert a high impedance probe signal into a low impedance signal which is supplied to a multiplexer 7. Isolating the probe signals in this manner is important in determining danger zones within the water.

Multiplexer 7 is programmed to sequentially supply the input signals from the respective probes to a signal conditioner 8. Operation of multiplexer 7 is such that signals S sent to signal conditioner 8 are forwarded to the signal conditioner in a predetermined sequence, for example, S1,S2,S3,S1,S2,S3, etc.; although, as discussed hereinafter, this format can be changed as a result of subsequent signal processing. Also, multiplexer 7 is programmable to control the time interval each sensor signal S1-S3 is sequentially transmitted to the signal conditioner.

Signal conditioner 8 is, in effect, a smart filter and operates on each sensor signal supplied to it to structure the signal into a prescribed format for further processing. In this regard, signal conditioner 8 comprises a series of modules which perform operations on the signals supplied to it. These include signal amplification by a module 8a, filtering by a module 8b, and an initial signal processing by a module 8c. These functions are important because research has found that measuring unfiltered and unprocessed absolute voltage readings can result in false readings.

Output signals from signal conditioner 8 are next rectified by a rectifier 9. Rectifier 9 takes each now amplified, filtered, and initially processed signal and converts it to a DC voltage which is supplied as an input to a microcontroller 10 which further processes each now converted DC voltage signal. Microcontroller 10 continuously processes the signals supplied to it to determine the voltage level in each monitored zone of water, compare it to a stored threshold value representing a dangerous condition, and determine if the sensed voltage level is below the threshold for a dangerous condition, if the voltage level is approaching the threshold, or if the voltage has reached or exceeded the threshold and that a dangerous condition exists in that zone of water.

Referring to FIG. 2, a TEST button 12 located on a front panel 112 of enclosure 106 enables a user of the system to program various settings into microcontroller 10. These settings include:

a) an OFFSET VOLTAGE which is programmed into the system to compensate for ground loops and "phantom" voltages;

b) a GAIN value which is an amplification factor that is applied to an input signal to increase the sensitivity of the shock alert warning system SA;

c) an ALARM LEVEL which is a voltage level which, when sensed by the system, causes audio and visual alarms to be activated; and, d) I/O which is a voltage level that triggers an output from the shock alert warning system to a remote location (e.g., the facility owner's house or office, a fire house or a police station, etc.). The output is provided by a warning module in the microcontroller.

Installed on front panel 112 of enclosure 100 is an LED display 114. Display 114 comprises a vertical arrangement of LEDs 116. Preferably, display 114 includes ten (10) LEDs although it may comprise more, or fewer, LED elements. Display 114 provides a visual indication to an observer of the measured voltage levels from sensor probes 1-3.

In this regard, the LEDs may display, for example, one of three colors with a green color LED 116g indicating the measured voltage is within a safe range of measurements, a yellow color LED 116y indicating that a measured voltage has exceeded a normal range of values and may be approaching a danger level, and a red color LED 116r indicating that the measured voltage has reached a danger level. A yellow or red light indication means that precautionary steps (e.g., getting people in the water out of the water or cautioning people near the water to stay out of it) should be taken. For simplicity of observation, the green color LEDs 116g are located at the lower end of display 114, the yellow color LEDs 116y above the green color LEDs, and the red color LEDs 116r at the upper end of the display. Illumination of the LEDs is driven by an output from microcontroller 10. Importantly, by viewing the LEDs in the vertical array of lights, one can immediately tell if the sensed water condition within a zone is approaching that of a dangerous condition. Because of this feature, a shock alert system of the present invention provides a predictive capability since as more of the yellow color LEDs becomes illuminated, it indicates that, for persons' safety they should leave the water, or if out of the water, not enter it.

Display 114 may further include a separate LED arrangement to identify which zone Z1-Z3 of water the vertical array of LEDs 116g, 116y, 116r currently represents.

LED display 114 comprises a portion of a visual display of signal intensity module 11 of apparatus 100. In addition to the visual display, apparatus 100 further includes an alarm 13 which consists of an integrated visual alarm indictor 13a installed on front panel 112 of enclosure 106 and an audio speaker 13s also mounted on the front panel. Visual alarm indicator 13a produces a flashing light when triggered by an output from microcontroller 10; while, at the same time, a siren sound is produced through speaker 13s. In addition, an alarm output signal is provided, as indicated at 14 in FIG. 1, to remote locations such as the dock owner's home or office, fire and police departments and other first responders.

It will be appreciated that alarm 13 may consist of more than one visual alarm indicator 13a and speaker 13s. Thus, as shown in FIG. 3B, a separate audio and visual alarm may be installed for each slip of a multi-boat docking facility to insure that anyone on or near the dock can see or hear an alarm. The audio and visual alarms 13a and 13s on front panel 112 of enclosure 106, and the remote audio and visual alarm indicators remain activated by microcontroller 10 so long as the sensed dangerous condition exists. Once the signals processed by microcontroller 10 indicate that the sensed voltage level in a zone has fallen below the established threshold and that a dangerous condition no longer exists, microcontroller 10 will deactivate the various audio and visual alarms.

Microcontroller 10 includes a memory which is programmable to broadcast a verbal alarm as part of the audio alarm. For example, when a potentially dangerous condition is sensed and alarm 13 is activated, an audio alarm is sounded through the speakers 13s followed by a verbal warning such as "swim away from the dock, electricity in the water." In addition, the memory can also provide a verbal message with the alarm output signal indicated at 14 informing the remote locations as to at which dock, slip, etc. the potentially dangerous condition has been detected.

Those skilled in the art will understand that if a dangerous condition is sensed in two or more of the monitored zones Z1-Z3, microcontroller 10 will not deactivate the audio and visual alarms until the dangerous condition no longer exists in all of those zones.

The buffer amplifiers 4-6, multiplexer 7, signal conditioner 8, rectifier 9, microcontroller 10, and the visual display and signal intensity module 11 are all installed on one or more printed circuit boards (PCBs) collectively indicated 120 in FIG. 1. The PCB(s) is installed in enclosure 106, together with backup battery B.

As previously discussed, operation of multiplexer 7 is such that signals S sent to signal conditioner 8 are forwarded to the signal conditioner in a predetermined sequence, for example, S1,S2,S3,S1,S2,S3, etc. The sequence and length of time each signal S1, S2, and S3 is propagated through multiplexer 7 is controlled by microcontroller 10. When signal processing by the microcontroller indicates a danger threshold of a voltage sensed by a probe 1, 2, or 3 is approaching, has reached, or exceeds a preset threshold voltage, microcontroller 10 will lock onto the signal from the respective probe and display both the zone Z1, Z2, or Z3 and level of the voltage for that zone on display 114.

In this regard, microcontroller 10 can command multiplexer 7 to only accept signals from the probe for the particular zone, to the exclusion of the signals from the other probes. In this instance, the signal sequence changes to, for example, S1,S1,S1, etc. until the voltage level in the zone falls below the threshold. Or, microcontroller 10 may command multiplexer 7 to process signals from the particular probe for that zone for a longer period during each sequence than the signals from the probes for the other zones. In this instance the sequence would become, for example, S1 . . . ,S2,S3,S1 . . . ,S2,S3. Or, microcontroller 10 may command multiplexer 7 to interleave the signal from the respective probe with those from the other probes. In this instance, the sequence would become, for example, S1,S2, S1,S3,S1,S2,S1,S3 etc.

In each circumstance, emphasis is on "tightly" monitoring the zone where a danger situation exists. If processing the signals from sensor probes 1-3 indicates a danger situation in more than one zone, microcontroller 10 controls multiplexer 7 to provide a variation of the second or third options described above so to closely monitor the situation with respect to both of the zones. If a danger situation exists in all three zones Z1-Z3, then microcontroller 10 commands multiplexer 7 to accept the signals in the same sequence as originally described.

What has been described is a shock alert warning system SA employing multiple sensor probes 1-3 and an associated apparatus 100 for detecting voltage levels in water that approaches or exceeds a danger threshold. The probes are placed in different areas (zones) about a dock to enhance coverage by the system. The apparatus and probes are easily installed and are safe and reliable in operation. The system operates to eliminate false readings and when sensed voltage levels from a particular area indicate a potentially dangerous condition, the system focuses on that area to insure everyone's safety. When a dangerous condition is detected, an audio alarm is sounded and a visual alert is provided, as well as remote locations being informed of the dangerous condition.

Figure 5:
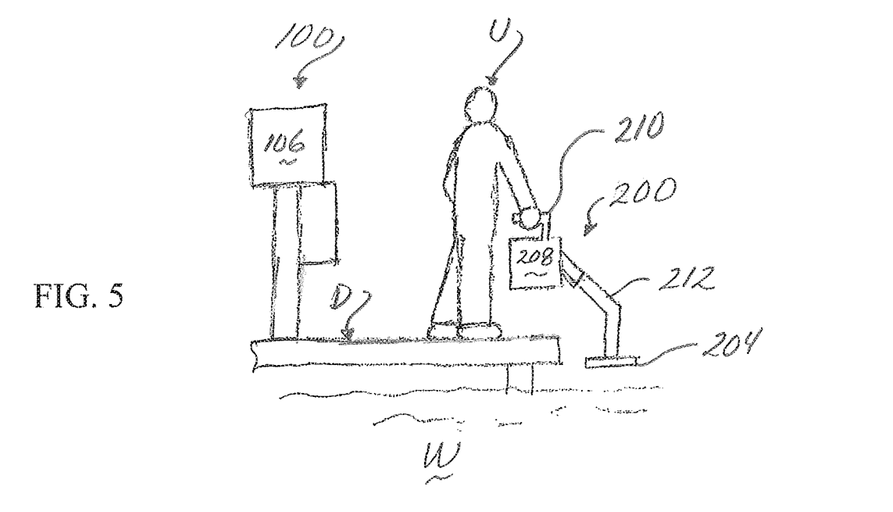
FIG. 5 illustrates a person using a handheld probe of the present invention to monitor for the presence of a voltage in the water.
Figure 6:
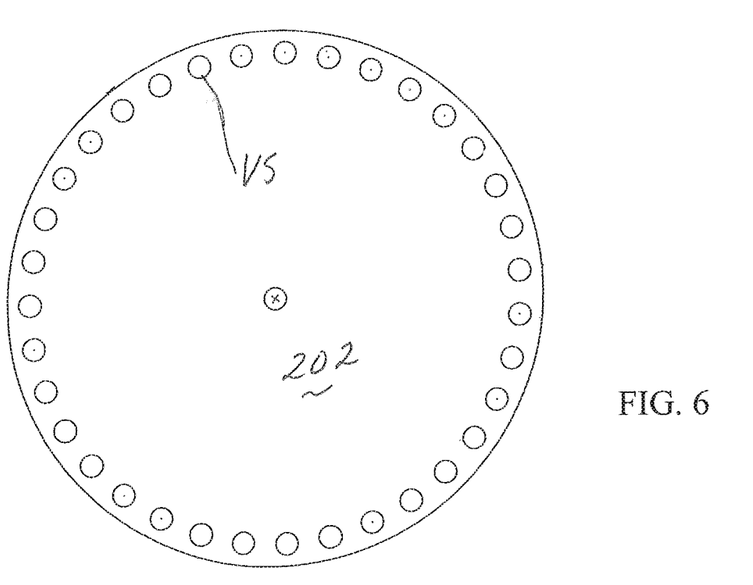
FIG. 6 illustrates a plurality of voltage sensors mounted in a probe head of the handheld probe; and, FIG. 7 is a simplified block diagram for processing sensor output signals.
Figure 7:
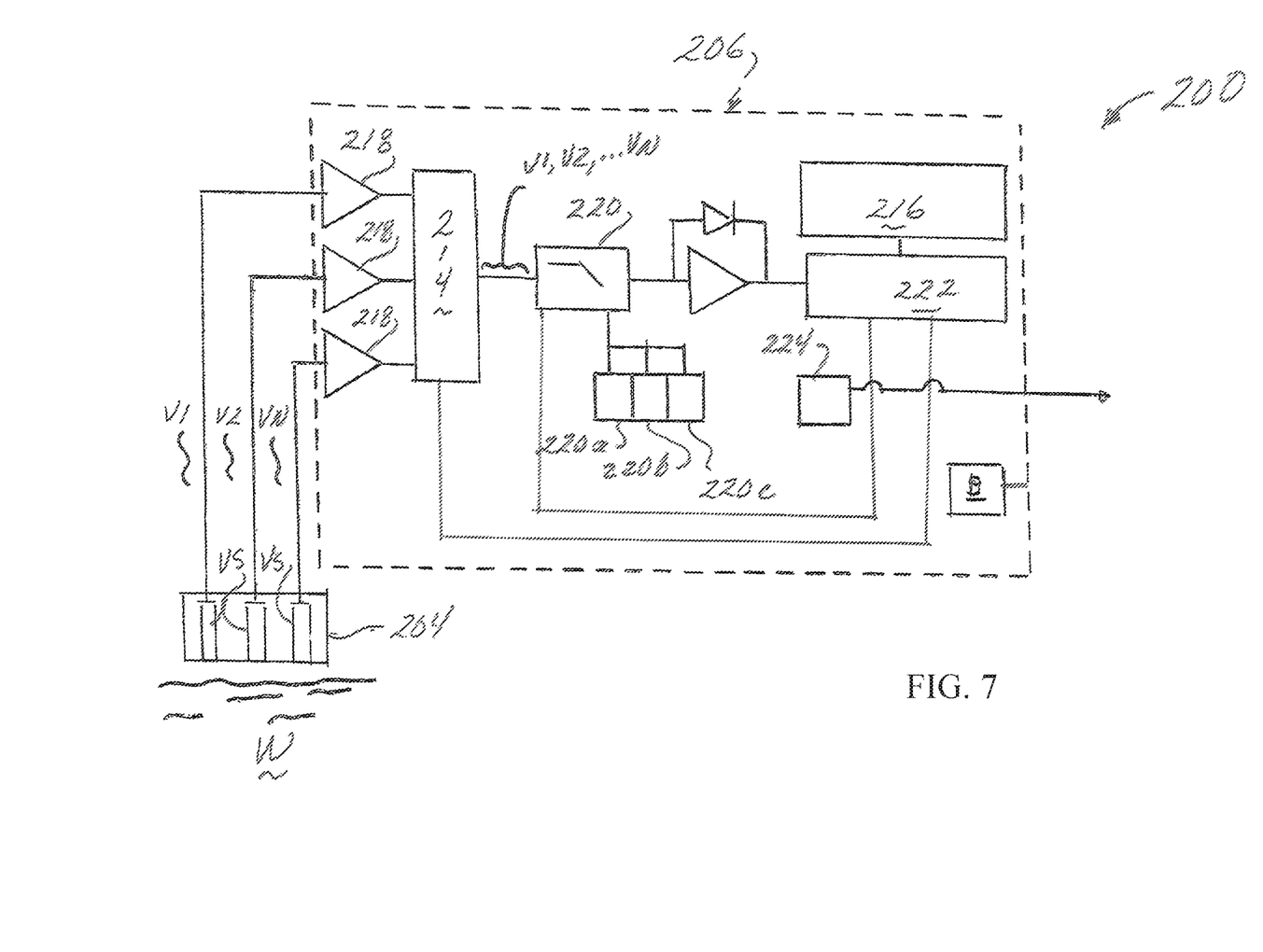

Referring now to FIGS. 5-7, a hand held probe indicated generally 200 is shown being used to detect the presence of a voltage in body of water W. While not shown in the drawings, it will be understood by those skilled in the art that the handheld probe can also be used on a boat, a float, or other similar structure to detect the presence of a voltage in the water thereabout. As described hereinafter, a condition sensed by probe 200 is transmitted to an enclosure 106 of apparatus 100 mounted on dock D, or other remote apparatus so that the presence of a dangerous, or potentially dangerous, condition is broadcast to appropriate warning devices.

Handheld probe 200 includes a plurality of voltage sensors or detectors VS as shown in FIG. 6. For drawing clarity, only one sensor VS is identified in the drawing. Those skilled in the art will understand that there may be more or fewer sensors VS than shown in the Fig. In FIG. 6, the voltage sensors are shown arranged in a predetermined, circular pattern on a disc 202 that is installed in a probe head 204. Again those skilled in the art will appreciate that the mounting arrangement may be different than that shown in the Fig. Each voltage sensor VS separately senses a voltage present in the body of water and supplies an electrical output signal V1, V2, . . . Vn representative of a level of the voltage to a processor 206 shown in FIG. 7. The signals V1, V2, . . . Vn are analog electrical signals.

Processor 206 is responsive to the signals supplied by voltage sensors VS to process the signals. The results of this processing include an output representing a gradient of any voltage present in the water and sensed by the sensors VS, a resultant electrical current, and a direction of flow of the electrical current.

Processor 206 and its associated components shown in FIG. 7 are installed in a housing 208 and are powered by a rechargeable battery B. As shown in FIG. 5, probe head 204 is physically attached to housing 208. The housing includes a handhold 210 for grasping by a user U to move the probe from one location to another over the body of water. In one embodiment of the invention, probe head 204 is fixedly attached to housing 208 by an angled support arm 212. In another embodiment of the invention, probe head 204 is telescopically attached to the housing by the support arm. Support arm 212 has a central, longitudinal shaft (not shown) through which electrical wiring is routed to and from housing 208 and probe head 204 to supply power to the voltage sensors VS and supply the sensors' output signals to the processor. Housing 208, support arm 212, and probe head 204 are all of an electrically non-conductive material.

Referring to FIG. 7, a multiplexer 214 is interposed between the voltage sensors VS and the processor for transmitting signals from the respective sensors to the processor in a predetermined sequence. Such a sequence is, for example, V1, V2, . . . Vn, V1, V2, . . . Vn; although, those skilled in the art will recognize that other sequences may be used within the scope of the invention.

A display 216 displays the results of the processing. This display includes any voltage gradient resulting from the sensing of a voltage in the body of water, a resultant electrical current, and the direction of current flow. In conjunction with apparatus 100, this information is used to determine if a currently dangerous or potentially dangerous condition exists in the water, and if a voltage is present in the water, and the source of the voltage. It will be recalled from the previously discussed Seaworthy magazine article that electric shock conditions typically arise from a) an electrical fault in which electricity escaping from somewhere in an electrical system is trying to find a path back to its source; b) an AC safety ground fault has occurred so stray current cannot return to ground through a ground safety wire; or c) there is no ground fault safety protection.

Referring again to FIG. 7, the analog voltage signals from the sensors VS are first routed through buffer amplifiers 218 to convert the high impedance sensor signal into a low impedance signal which is supplied to multiplexer 214. Signals then propagated through the multiplexer are routed to a signal conditioner 220 for conditioning prior to being processed by a microcontroller 222 of processor 206. Signal conditioner 220 operates on each sensor signal supplied to it to format the signal into a prescribed format for further processing. The signal conditioner performs signal amplification by an amplification module 220a, filtering by a filter module 220b, and an initial signal processing by a module 220c. Output signals from signal conditioner 220 are next rectified by a rectifier 224 which converts each now amplified, filtered, and initially processed signal to a DC voltage that is supplied as an input to microcontroller 222 for further processing. The microcontroller continuously processes the signals supplied to it to generate the voltage gradient and electric current profiles.

Next, processor 206 includes a communications module 226. The results of the processing performed by microcontroller 222 are transmitted from probe 200 to both local and remote monitoring devices such as apparatus 100 installed on dock D, units at a dock manager's office, and first responder locations. Such communications are wirelessly transmitted between the probe and the local and remote monitoring devices.

Finally, and as shown in FIG. 5, a probe docking station 230 is installed on dock D for storing probe 200 when the probe is not in use. Docking station 230 includes a battery charger (not shown) for recharging the probe's rechargeable battery B, when the probe is stored on the docking station.

In view of the above, it will be seen that the several objects and advantages of the present disclosure have been achieved and other advantageous results have been obtained.

The invention claimed is:

1. A hand held probe for detecting the presence of a voltage in a body of water comprising:
    a plurality of voltage sensors and a single probe head in which the sensors are installed in a predetermined pattern, each sensor separately sensing a voltage present in the body of water and supplying electrical output signals representative of a level of the voltage when the probe is passed over a body of water at a level above the water whereby the sensors are not immersed in the water;
    a processor responsive to the signals supplied by the sensors to process the signals, an output from the processor representing results of the processing and including a gradient of any voltage present in the water, a resultant electrical current, and a direction of flow of the electrical current;
    a housing in which the processor is installed, the probe head being physically attached to the housing;
    a multiplexer interposed between the sensors and the processor for transmitting signals from the respective sensors to the processor in a predetermined sequence; and,
    a display displaying the results of the processing including any voltage gradient, the resultant electrical current, and the direction of current flow, this information being used to determine if a currently dangerous or potentially dangerous condition exists in the water, and if a voltage is present in the water, the source of the voltage.

2. The system of claim 1 in which the housing includes a handhold for grasping by a user to move the probe from one location to another over the body of water.

3. The probe of claim 2 in which the probe head is fixedly attached to the housing.

4. The probe of claim 2 in which the probe head is telescopically attached to the housing.

5. The probe of claim 1 in which the display includes a visual display located on the housing.

6. The probe of claim 5 in which the visual display displays one or more of:
    a voltage gradient;
    a level of a current and a direction of current flow; and, whether any level of detected voltage or current is approaching, has reached, or exceeds a predetermined level of danger to someone in or near the body of water.

7. The probe of claim 1 further including means communicating the results of the processing by the processor to both local and remote monitoring devices.

8. The probe of claim 7 in which communications are wirelessly transmitted between the probe and the monitoring devices.

9. The probe of claim 1 further including a battery for supplying power to the probe and its components.

10. The probe of claim 9 in which the battery is a rechargeable battery.

11. The probe of claim 1 further including a signal conditioner to which signals from the sensors propagated through the multiplexer are supplied for conditioning prior to being processed by the processor.

12. The probe of claim 11 wherein the signal conditioner includes:
   amplification means for amplifying each sensor signal propagated through the multiplexer;
   a filter filtering each amplified sensor signal; and,
   signal processing means performing an initial processing of each amplified and filtered signal prior to the processing thereof.

13. The probe of claim 10 further including a probe docking station for storing the probe when not in use.

14. The probe of claim 13 wherein the docking station includes a battery charger for recharging the probe's rechargeable battery.

15. The probe of claim 1 in which the housing and the probe head are of an electrically non-conductive material.

16. A hand held probe for detecting the presence of a voltage in a body of water comprising:

a plurality of voltage sensors and a single probe head in which the sensors are installed in a predetermined pattern, each sensor separately sensing a voltage present in the body of water and supplying electrical output signals representative of a level of the voltage when the probe is passed over a body of water at a level above the water whereby the sensors are not immersed in the water;

a processor responsive to the signals supplied by the sensors to process the signals, an output from the processor representing results of the processing and including a gradient of any voltage present in the water, a resultant electrical current, and a direction of flow of the electrical current;

a housing in which the processor is installed, the probe head being physically attached to the housing;

a multiplexer interposed between the sensors and the processor for transmitting signals from the respective sensors to the processor in a predetermined sequence; and, a display displaying the results of the processing including any voltage gradient, the resultant electrical current, and the direction of current flow, this information being used to determine if a currently dangerous or potentially dangerous condition exists in the water, and if a voltage is present in the water, the source of the voltage, the visual display including a plurality of LEDs arranged in a predetermined manner, the LEDs displaying one of a plurality of colors with one of the colors signifying a measured voltage is in a safe range of voltages, a second of the colors signifying the measured voltage is approaching a danger level, and a third of the colors signifying the measured voltage has reached or exceeded the danger level.

* * * * *